(12) United States Patent
Kern et al.

(10) Patent No.: US 12,147,303 B2
(45) Date of Patent: Nov. 19, 2024

(54) ERROR PROCESSING FOR NON-VOLATILE MEMORIES

(71) Applicant: Infineon Technologies AG, Neubiberg (DE)

(72) Inventors: Thomas Kern, Aschheim (DE); Michael Goessel, Mahlow (DE); Alexander Klockmann, Taufkirchen (DE); Thomas Rabenalt, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 113 days.

(21) Appl. No.: 18/159,365

(22) Filed: Jan. 25, 2023

(65) Prior Publication Data
US 2023/0267039 A1   Aug. 24, 2023

(30) Foreign Application Priority Data

Jan. 26, 2022   (DE) .......................... 102022101798.2

(51) Int. Cl.
*G06F 11/10*   (2006.01)
(52) U.S. Cl.
CPC ................ *G06F 11/1068* (2013.01)
(58) Field of Classification Search
CPC ................................... G06F 11/1068
See application file for complete search history.

(56) References Cited

U.S. PATENT DOCUMENTS

| | | | | |
|---|---|---|---|---|
| 4,358,848 A | * | 11/1982 | Patel | ................ G06F 11/1028 714/E11.046 |
| 10,903,859 B2 | | 1/2021 | Kern et al. | |
| 2011/0239083 A1 | * | 9/2011 | Kanno | ................ G11C 16/10 714/756 |
| 2018/0083653 A1 | * | 3/2018 | Khayat | ............. H03M 13/2927 |

FOREIGN PATENT DOCUMENTS

| | | |
|---|---|---|
| DE | 102017125617 A1 | 5/2019 |
| DE | 102021109391 B3 | 8/2022 |

OTHER PUBLICATIONS

Bossen, "b-Adjacent Error Correction", IBM Journal of Research and Development, vol. 14, No. 4, Jul. 1970, pp. 402-408.
Fujiwara, "Code Design for Dependable Systems", Wiley-Interscience, Jun. 1, 2006, pp. 65-68.
Lin et al., "Error Control Coding", Prentice Hall, Jan. 1, 1983, pp. 170-177.
Office Action from counterpart German Application No. 102022101798.2 dated Oct. 19, 2022, 8pp.
Okano et al., "A Construction Method of High-Speed Decoders Using ROM's for Bose-Chaudhuri-Hocquenghem and Reed-Solomon Codes", IEEE Transactions on Computers, vol. C-36, No. 10, Oct. 1, 1987, pp. 1165-1171.

(Continued)

*Primary Examiner* — Guy J Lamarre
(74) *Attorney, Agent, or Firm* — Shumaker & Sieffert, P.A.

(57) ABSTRACT

A solution is proposed for error processing, wherein n byte error positions of n byte errors are predefined (where n is a positive integer), wherein this involves determining whether there is a further byte error position on the basis of the n byte error positions and on the basis of n+1 error syndrome components of a first error code.

15 Claims, 6 Drawing Sheets

(56) References Cited

OTHER PUBLICATIONS

Wicker, "Error Control Systems for Digital Communication and Storage", Prentice Hall, 1995, pp. 214-224, (Applicant points out, in accordance with MPEP 609.04(a), that the year of publication, 1995, is sufficiently earlier than the effective U.S. filing date, so that the particular month of publication is not an issue.).

* cited by examiner

ERROR PROCESSING FOR NON-VOLATILE MEMORIES

TECHNICAL FIELD

The present disclosure relates to semiconductor components, in particular to memories and semiconductor components containing memories.

BACKGROUND OF INVENTION

There is an ongoing need to store ever-increasing amounts of data in semiconductor memories. For example, non-volatile memories (NVM) retain stored data even after being powered off.

Errors can occur in the stored data and in many applications it is necessary to identify and if possible correct such errors.

Data present in the form of bytes may be detected byte by byte and corrected byte by byte. In this case, a byte can comprise at least two bits. At least one error in at least one bit of a byte is referred to as a byte error. If at least one bit of a byte is erroneous, a byte error is present. If only at least one bit of a single byte is erroneous, this corresponds to a 1-byte error.

The correction of 1-byte errors is described for example in [Bossen, D.: b-Adjacent Error Correction, IBM J. Res. Dev., July 1970, pages 402 to 408].

If bits of two different bytes are erroneous, this corresponds to a 2-byte error. Accordingly it holds true that a k-byte error is present if bits in k bytes are erroneous (i.e. at least one bit in each of the k bytes has an error).

The byte error correction can be effected by means of a Reed-Solomon code, for example.

A circuit arrangement for correcting two-byte errors using a Reed-Solomon code is described in OKANO [Okano, H., Imai, H.: A Construction Method of High-Speed Decoders Using ROM's for Bose-Chaudhuri-Hocquengiem and Reed-Solomon Codes, IEEE TRANSACTIONS ON COMPUTERS, VOL. C-36, NO. 10, October 1987, pages 1165 to 1171]. In this case, it is disadvantageous that the correction of 2-byte errors described in OKANO is comparatively slow.

DETAILED DESCRIPTION

An error code may in general be used to correct bytes. For example, 43 data bytes may be stored together with 3 bytes of error code. Should a failure occur and the data become corrupted in one of the data bytes the data in the error code may be used to identify which of the data bytes are incorrect and to correct that data byte. Such an error code will be referred to as a first error code in the following.

A further code, referred to as a second error code may also be provided. Such a second error code may be linked to the physical structure of the memory which accordingly will now be further described, purely by way of example.

Figure 1:
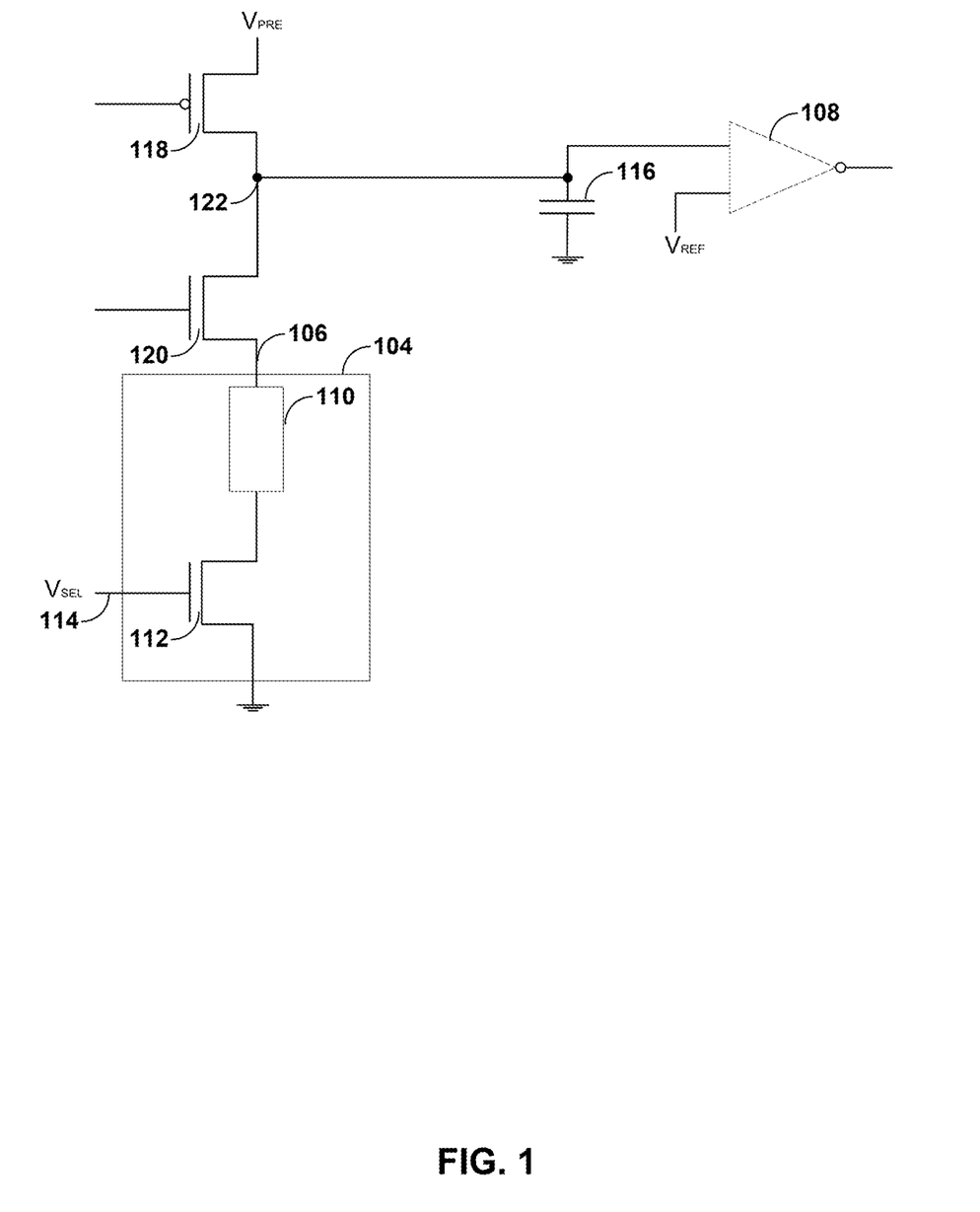
FIGS. 1 to 3 show a memory.

In an embodiment, a memory 100 includes a plurality of physical storage bytes 102 each of 8 bits 104. Note that in this example the term "byte" is used for a data size. In other examples, the byte may be 6 or 10 bits for example, or indeed any desired number of bits.

The memory may be a resistive random access memory, RRAM, in which each bit of data is stored using a material that can exist in a plurality of different resistance states. For example, a high resistance may indicate a 0 bit and a low resistance a 1 bit.

FIG. 1 illustrates a single bit 104 having storage element 110 connected to a corresponding bit line 106 which is in turn connected to node 122. The storage element 110 is connected through select transistor 112 and a source line to ground. The bit line 106 is connected to a plurality of storage elements 110 (not shown in FIG. 1) each of which has a respective select transistor connected to a respective word line 114.

Node 122 is connected to one input of a read-out comparator 108 and also to capacitor 116. The other input of comparator 108 is connected to a voltage reference at voltage $V_{REF}$. One PMOS transistor 118 connects node 122 to a positive precharge voltage $V_{PRE}$, and NMOS transistor 120 connects node 122 to the bit line 106. Thus, single bit 104 is coupled to the one input of the read-out comparator 108.

In use, a signal on word line 114 selects a specific bit 104 using the respective select transistor 112.

Capacitor 116 is charged to precharge voltage $V_{PRE}$ by switching transistor 118 on. Then, transistor 118 is switched off and the capacitor discharges through transistor 120, storage element 110 and select transistor 112 towards ground.

In the event that the storage element 110 is in a low resistance state the capacitor 116 will discharge faster than if the storage element 110 is in the high resistance state. This means that the voltage will fall below voltage $V_{REF}$ more quickly and so comparator 108 will be triggered more quickly.

The data stored in the byte 102 is stored using a second code in which all data is represented by a byte with four bits having the value 1 and four bits having the value 0. In this example, with 8 bits in each byte, this means that 6 bits of input data may be stored. For example, input data 000000 may be represented by 11110000, input data 000001 by 11100001, and so on, so that each possible 6 bit input data value has a different value in the second code. This allows the data to be read as will now be described.

Figure 2:
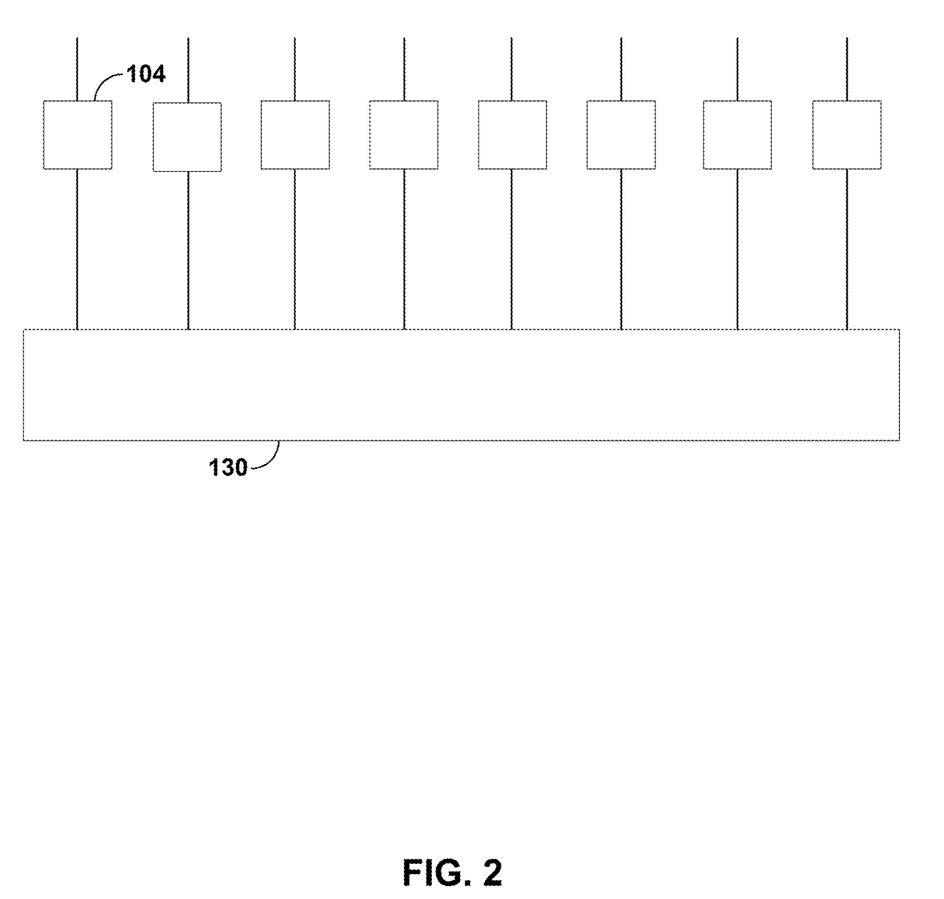

FIG. 2 illustrates a plurality of bits 104 making up byte 102. The respective outputs from respective comparators 108 of the respective bytes are fed into decoder 130).

Figure 3:
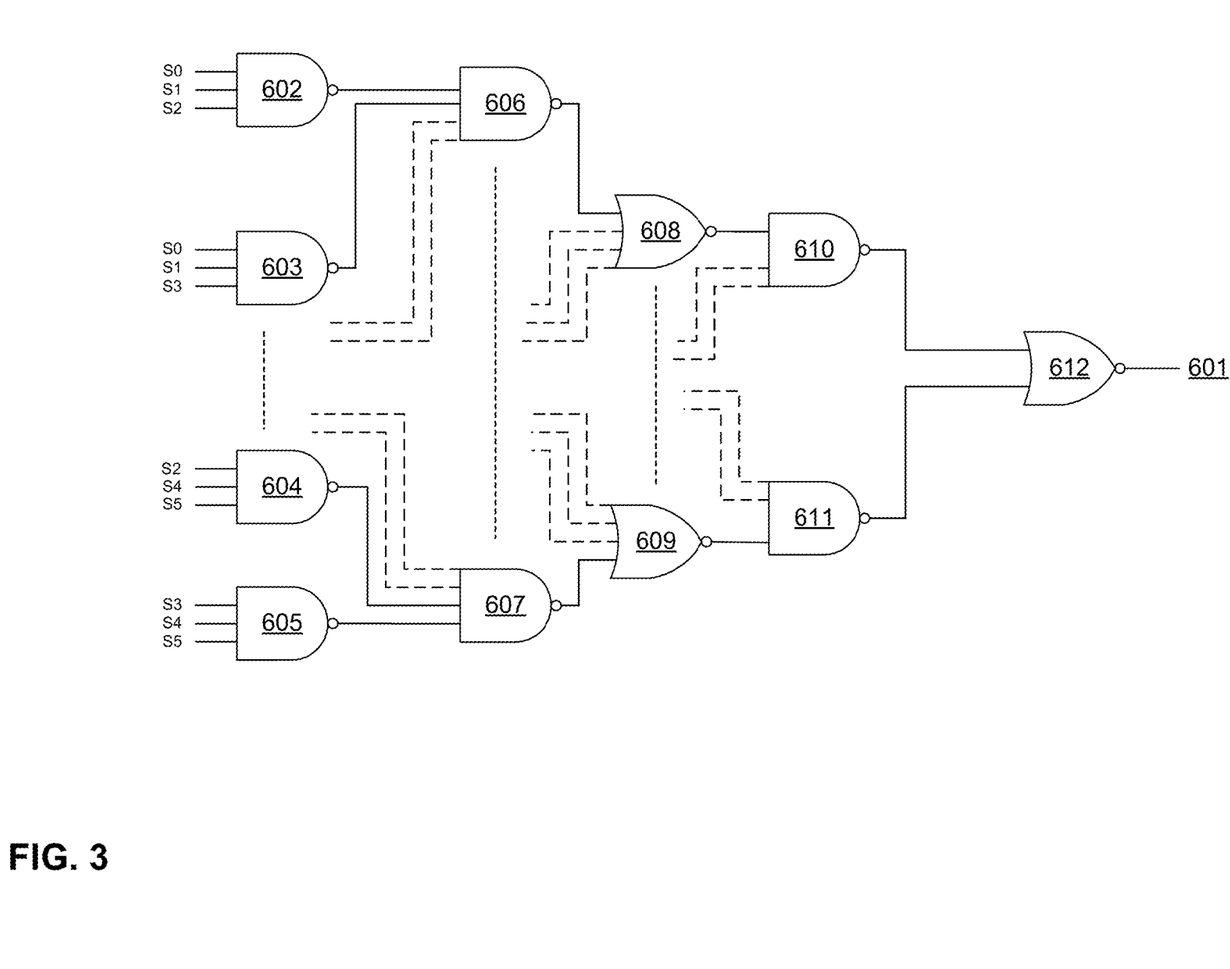

The circuit of decoder 130 is illustrated in FIG. 3. A plurality of NAND gates 602, 603, 604, 605, are used as an input stage 610. Each of these triggers when the four inputs all rise to the value 1. An output stage 620 includes a plurality of further NAND gates 606, 607, 610, 611 and NOR gates 608, 609 612, including output NOR gate 612 arranged such that output 601 of the circuit triggers when one of the input stage NOR gates 602, 603, 604, 605 is triggered. This means that output 601 will be triggered as soon as the capacitors 116 of exactly four respective bits 104 have all discharged to the voltage $V_{REF}$. The output then stops the read operation in this state, with the outputs of four comparators being in the "1" state and the other four comparators of the eight bit byte being in the "0" state.

Since it is known that the codeword stored in byte 102 must have four 1 and four 0 values, the four bits that have discharged most quickly may be identified as the four "1" values of the codeword and the other four bits as "0". Accordingly this value (all eight bits) may be output as the data read from the memory. If the output is correct, the eight bits will include four 1 bits and four 0 bits, for example 10101010, which is a codeword of the second code.

It takes a finite time for the output 601 to stop the read operation and it is possible therefore that a further bit triggers. In this case, the output may include a different number of 1 and 0 bits, for example 10101110. In this case, this value is not a codeword of the second code.

Note that in this way the memory may store a plurality j of physical bytes. Each physical byte in the memory includes a number k of bits, where k is a positive integer. In the example described above k=8. Each physical byte represents a logical byte with m bits, where m is a positive integer less than k. In the example m is 4. Thus, each 8 bit codeword, for example 10101010, stored as a physical byte, represents a 6 bit logical There is a one to one byte, for example 110110. correspondence between physical and logical bytes, but the difference is that because of the use of the second code the number of bits of each logical byte is lower than the number of bits of each physical byte.

The j logical bytes in this case may be selected from a first error code such as a Reed-Solomon code. Only certain combinations of j logical bytes are codewords of this first error code. If the j logical bytes read from the memory are not a codeword of the first error code, an error has occurred which may in some cases be corrected.

The additional information from the second error code which in this example is related to the physical structure of the decoder 130 of the memory may be combined with information from the first error code to improve error detection and error correction, as will now be described in more detail.

Byte-error-detecting and byte-error-correcting codes (also referred to as error code s) can be used for error correction and error detection in respect of data stored in memory cells, for example. One example of an error code is the Reed-Solomon code (in this respect, also see explanations below).

In the case of a byte error, the position of the erroneous bytes is to be determined and, if the byte error is intended to be corrected, the correct value of the byte is also to be ascertained.

The position of the erroneous byte is determined on the basis of the byte error position (also referred to as byte error position value, indicating which byte or which bytes is or are (possibly) erroneous). By way of example, a value 1 for the byte error position can indicate that the byte is erroneous, and a value 0 can indicate that the byte is not erroneous.

A byte error value indicates the value by which an erroneous byte differs from its correct value. If each byte comprises m bits, then the byte error value also comprises m bits. By way of example, a correction can be carried out by exclusive-ORing (XORing) the bits of the erroneous byte component by component with the associated bits of the byte error value.

A t-byte error states that a number of t bytes is erroneous. In order to correct a t-byte error, t byte error positions and t byte error values are required.

For a byte having m bits, the byte can be described as an element of the Galois field $GF(2^m)$. The following generally holds true: if m p-order values where p>2 form a byte and if p is a prime number, a byte can be described as an element of the Galois field $GF(p^m)$. In this case, m is for example a positive integer greater than 2.

In the present example, bytes having m bits are used. Accordingly, there are $2^m$ different m-bit bytes.

By way of example, the intention is for a first number of N byte errors to be corrected. Accordingly, an N byte error (N≥1) is corrected.

For a second number $N_1$ of byte errors, the corresponding byte error position at which a byte error has occurred may already have been determined. During a correction, it is then necessary only to determine the byte error value for these $N_1$ byte errors at the known byte error positions.

For a third number $N_2$ of byte errors, it may be necessary to determine both the byte error value and the byte error position. In this case, $N_1+N_2=N$ may hold true. In this case, $N_2 \geq 1$ and it may hold true that $N_2=1$.

Example: Two Error Codes

By way of example, the m-bit byte in the error-free case forms a code word of the Reed-Solomon code. The Reed-Solomon code here serves as a first error code.

In addition, the m-bit byte can be transformed into a code word of a second error code before it is stored in a memory. The second error code can be an $n_1$ out-of-n code.

In a first example with m=4 a plurality of 4 bit bytes in the error-free case form the code word of a Reed-Solomon code, the first error code. By way of example, at least one byte of the code word may be a check byte of the Reed-Solomon code. There are $2^m=2^4=16$ different values per byte in this example.

In this example, the second error code is a 3-out-of-6 code having 20 code words. A 3-bit byte of the Reed-Solomon code can for example be transformed into a code word of the second error code and be stored in six memory cells of a memory (in this respect, cf. e.g. U.S. Pat. No. 10,903,859 B2). In this case, each 6-bit byte of the first error code is reversibly uniquely transformed into one of the 20 code words of the 3-out-of-6 code of the second error code. These code words represent the m bit logical byte. This example corresponds with the example of FIGS. 1 to 3 above.

Those skilled in the art will realise that different values of m may be used, to allow more data to be stored in each byte.

In a further example with m =6 a plurality of 6-bit bytes in the error-free case form the code word of a Reed-Solomon code. By way of example, at least one byte of the code word may be a check byte of the Reed-Solomon code. There are $2^m=2^6=64$ different values per byte in this example.

In this example, the second error code is a 4-out-of-8 code having 70 code words. A 6-bit byte of the Reed-Solomon code can for example be transformed into a code word of the second error code and be stored in eight memory cells of a memory. In this case, each 6-bit byte of the first error code is reversibly uniquely transformed into one of the 70 code words of the 4-out-of-8 code of the second error code.

In the course of reading out from the memory, in the error-free case, code words of the 4-out-of-8 code are read out and transformed back into 6-bit bytes. In the error-free case, the 6-bit bytes present after the inverse transformation once again yield a code word of the first error code.

As early as in the course of reading out from the memory, it is possible to check whether a code word of the 4-out -of-8 code is present: if 4 ones and 4 zeros have not been read, a code word of the 4-out-of-8 code is not involved. In this case, the byte read out is erroneous, i.e. a byte error position was determined for this byte by means of the 4-out-of-8 code.

The read-out non-code word of the 4-out-of-8 code is transformed back into an (erroneous) m-bit byte. A predefined value from the 64 possible values (e.g. the value 0) can be used for this purpose. It is advantageous, however, for information that this byte is erroneous to be provided with detection of a non-code word of the 4-out-of-8 code. The inverse-transformed 6-bit value then no longer occurs because it has to be assumed that this byte has to be corrected by means of the second error code. In accordance with the explanations above, only the byte error value has to be determined for this erroneous byte.

Consequently, the checking of the values of the second error code that are read out from the memory cells makes it possible to determine at least one byte error position for the bytes of the first error code. In this case, it is advantageous that the differentiability of the bytes is maintained by the transformation and the inverse transformation: each 6-bit byte is assigned an 8-bit byte, and vice versa. The byte error position thus uniquely identifies the byte, irrespective of whether it has 6 bits or 8 bits.

The fact that the first error code does not have to be used to determine this byte error position is an advantage. Check bytes can thus be saved in the first error code.

Figure 4:
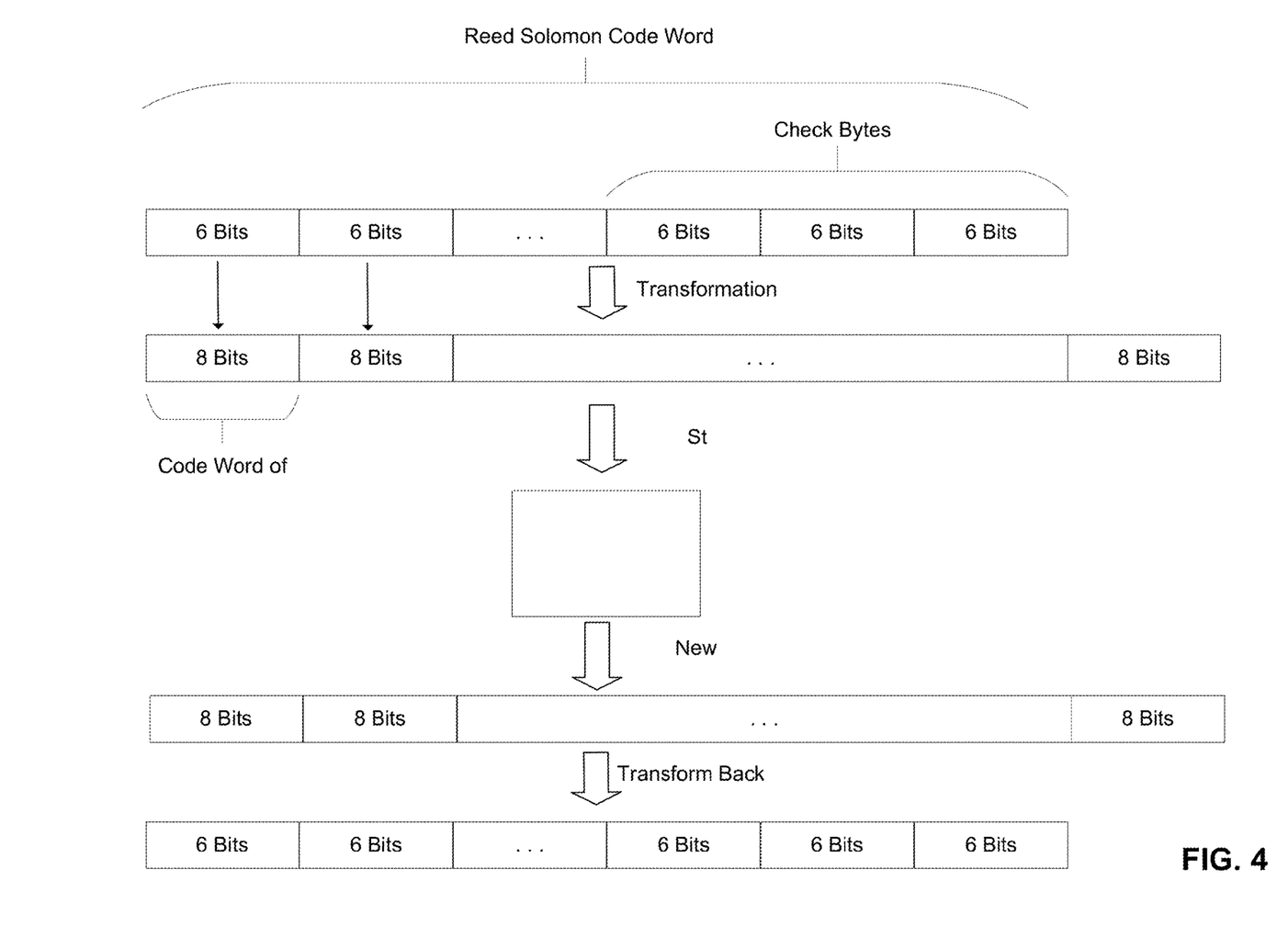
FIG. 4 shows one example of the use of a first and a second error code, wherein the second error code is used to provide at least one byte error position which can be used by the first error code for correcting at least one further byte error.
Figure 5:
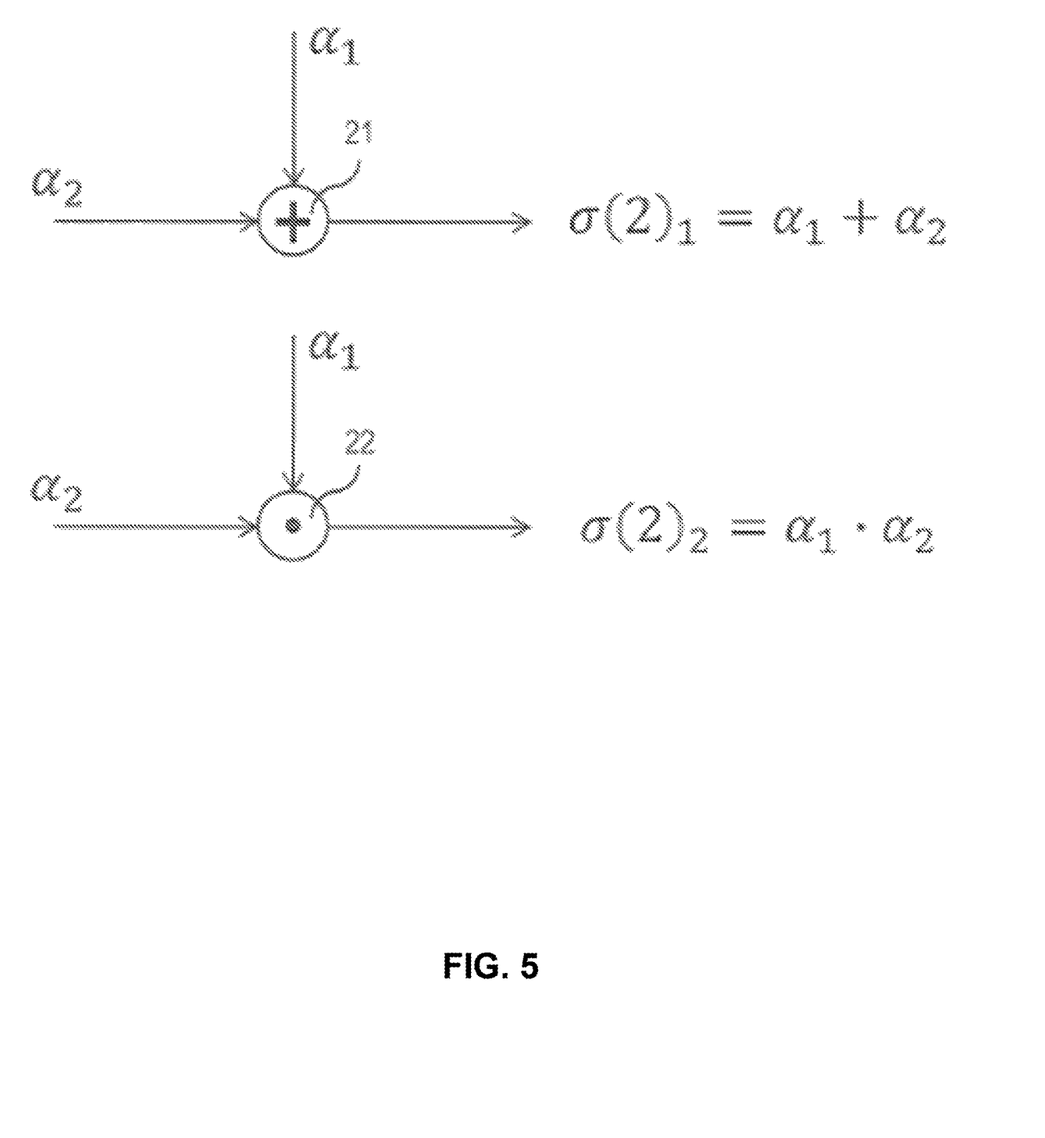
FIG. 5 shows a symbolic circuit diagram for determining $\alpha_1 + \alpha_2$ and $\alpha_1 \cdot \alpha_2$.
Figure 6:
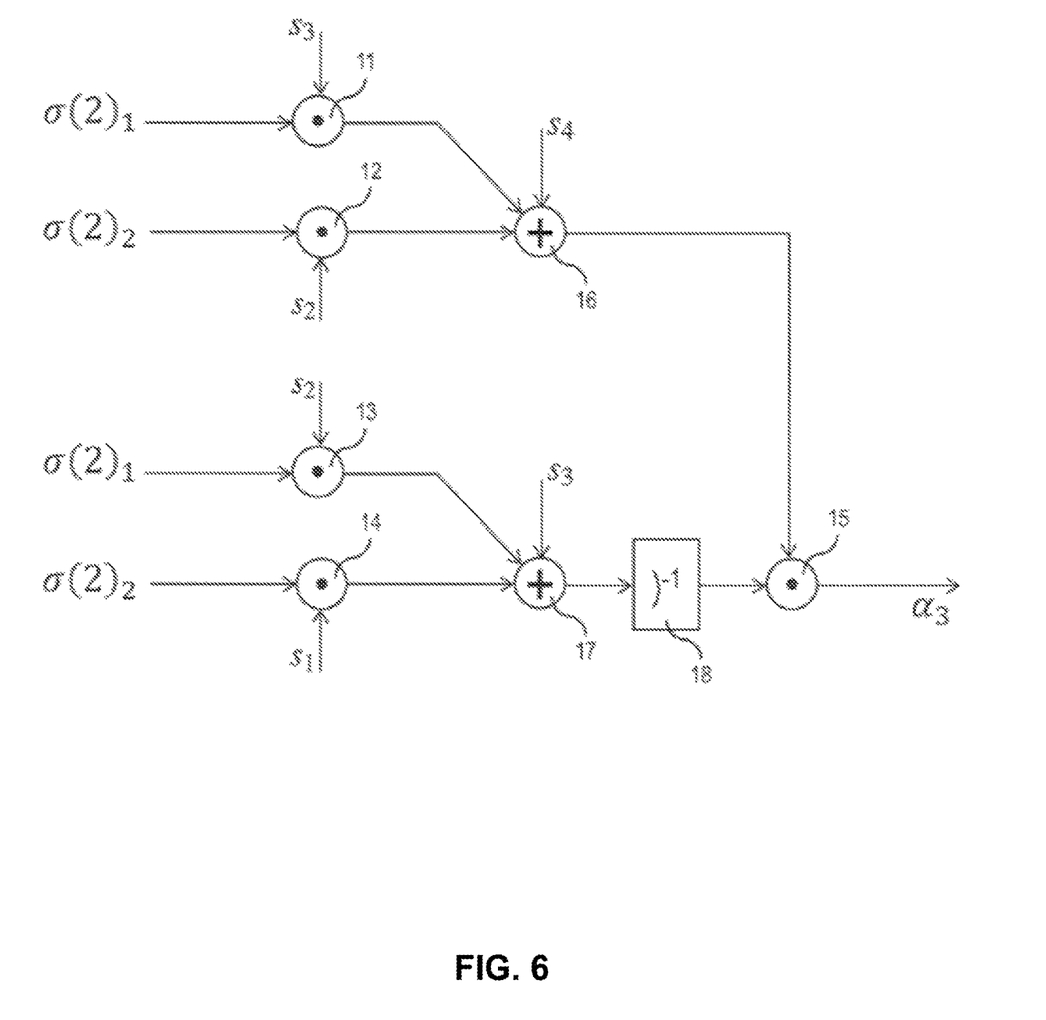
FIG. 6 shows a symbolic circuit diagram for determining a further byte error position $\alpha_3$.

FIG. 4 illustrates one example of the use of a first and a second error code. In this example, 43 bytes of payload data are supplemented by 3 check bytes. Each byte comprises 6 bits. The (43+3=) 46 bytes yield (in the error-free case) a code word of the first code, here of a Reed-Solomon code (RS code). In this case, j=46 and m =6.

In a next step, each of the bytes of the code word of the RS code is transformed into a code word of the second code. In the present example, the second code is a 4-out-of-8 code: the code words of the 4-out-of-8 code have 4 ones and 4 zeros. Each byte is thus a physical byte with k=8 bits. 46 bytes arise once again after the transformation. These bytes are stored in the memory as j 8-bit codewords of the second error code. Each of the 46 codewords is thus stored in a physical byte of k=8 bits representing the structure of the memory.

To read data from the memory, j=46 bytes of physical bytes of 8 bits are read from the memory. In the course of this, a check is made as to whether each of the bytes read is a code word of the 4-out-of-8 code.

In accordance with one exemplary implementation, and as explained above, the individual bytes can be read from the memory using time. In this case, the read operation can advantageously already be ended when 4 bits of the same type, i.e. either 4 times the value 0 or 4 times the value 1, have been read. For the remaining bits that have not arrived, the respective other value is then assumed. This approach uses the property of the 4-out-of-8 code, in which code words have 4 ones or 4 zeros. Errors may occur here such that five instead of four identical values are read and a code word of the second code is thus no longer present. For details with regard to reading memory cells in the time domain, reference should be made to U.S. Pat. No. 9,805,771 B2, for example: in this case, a read current formed in the course of reading out depending on a resistance value stored in the memory cell is integrated in a capacitor. The memory cells that reach a specific voltage of the capacitor the fastest in the temporal order can each be assigned the value 1, and the cells that reach the specific voltage the slowest can each be assigned the value 0.

If the 8-bit byte read from the memory is a code word of the second error code, i.e. of the 4-out-of-8 code, then the inverse transformation of this code word into a 6-bit value (more generally, into m bits) is effected in accordance with the assignment mentioned above. If all 46 bits are code words of the second error code, the inverse transformation into 46 6-bit bytes takes place, which are a code word of the first error code, i.e. of the RS code, in the error-free case.

If at least one of the 8-bit bytes read is not a code word of the 4-out-of-8 code, then there is at least one byte error position, which is communicated to the subsequent correction step in order to initiate the correction of this at least one erroneous byte by means of the first error code.

The approach described here also allows the detection of the further byte error position by way of the first error code (with subsequent correction), which position is associated with a 4-out-of-8 code word that was corrupted into a further 4-out-of-8 code by means of a plurality of errors. This incorrect 4-out-of-8 code word is not detectable by the second error code and the byte error position for this code word thus also cannot be ascertained by way of the second error code. However, an additional byte error may be present which is detected by the second error code. The second error code yields the byte error position for this additional byte error. On the basis of this byte error position, the first error code can then ascertain and correct the further byte error position (corresponding to the corrupted 4-out-of-8 code word).

Alternative Second Error Codes

The invention is not restricted to the second error code being an $n_1$-out-n code. By way of example, an m-bit byte of the first error code can be mapped onto an (m+1)-bit byte of the second error code by a parity bit additionally being formed from the m bits of the byte of the first error code and being appended to the m bits of the first error code. A code word of the second error code may be an (m+1)-bit word having an even number of ones.

In accordance with a further example, the m bits of a byte of the first error code can also be stored in duplicated fashion and thus redundantly in the memory. In the course of reading, the second error code can be used to monitor whether the same m-bit byte was obtained twice.

Moreover, different m-bit bytes of the first error code can be transformed into code words of the second error code (e.g. different error codes) according to different specifications. In this regard, for example, a first 6-bit byte can be transformed into a code word of an 4-out-of-8 code and a second 6-bit byte is transformed into a 7-bit byte (6 bits with an additional parity bit).

The second error code is not absolutely necessary for the approach described here. All that is necessary is that, for an erroneous byte, a byte error position is determinable which can be used in the determination of a further byte error position by the first error code and does not have to be determined by the latter.

By way of example, measured values that are in a specific previously known range of values can be stored for each payload data byte. The measured value can be e.g. temperature, air pressure, length of components or the like.

The payload data bytes can be stored together with check bytes in a memory, the payload data bytes and the check bytes (in the error-free case) forming a code word of the first error code. If, in the course of reading from the memory, it is found that a payload data byte is not in the known range values, then a byte error position can be detected for this byte.

The examples described here make it possible in particular to improve the error correction and error detection of a first error code. In this case, the further byte error position is intended to be determined efficiently and with low complexity.

General Description of Reed-Solomon Codes

Some terms and properties of Reed-Solomon codes are explained below.

By way of example, t-byte-error-correcting codes and t-byte-error-correcting and (t+1)-byte-error -detecting codes are considered. In particular, the cases t=2 and t=1 are taken into account.

By way of example, known Reed-Solomon codes can be used as byte-error-correcting codes. For Reed-Solomon codes reference should be made for example to [Lin, S., Costello, D.: Error Control Coding, Prentice Hall, 1983, pages 170 to 177] or [Wicker, S.: Error Control Systems for Digital Communication and Storage, Prentice Hall, 1995, pages 214 to 224].

A 1-byte-error-correcting and 2-byte-error-detecting Reed-Solomon code has an H matrix $H_{Byte}^*$ as follows:

$$H_{Byte}^* = \begin{pmatrix} \alpha^0 & \alpha^1 & \alpha^2 & \cdots & \alpha^{2^m-2} \\ \alpha^0 & \alpha^2 & \alpha^4 & \cdots & \alpha^{2(2^m-2)} \\ \alpha^0 & \alpha^3 & \alpha^6 & \cdots & \alpha^{3(2^m-2)} \end{pmatrix} \quad (1)$$

In this case, $\alpha^i$ are elements of the Galois field $GF(2^m)$. They are present for example in an exponential representation. $\alpha$ can be a primitive element of the Galois field $GF(2^m)$. The exponents j of $\alpha^j$ should be interpreted modulo $2^m-1$.

It is possible to derive from the H matrix in accordance with equation (1) an H matrix $$H_{Byte} = \begin{pmatrix} \alpha^0 & \alpha^0 & \alpha^0 & \cdots & \alpha^0 \\ \alpha^0 & \alpha^1 & \alpha^2 & \cdots & \alpha^{2^m-2} \\ \alpha^0 & \alpha^2 & \alpha^4 & \cdots & \alpha^{2(2^m-2)} \end{pmatrix} \quad (2)$$

by multiplying, for i=0, ..., ($2^m-2$) the i-th column by $\alpha^{-i}$. This changes only the shape of the H matrix, and not the code, since $\alpha^{-i} \neq 0$. This is also described for example in [Fujiwara, E.: Code Design for Dependable Systems, Wiley, 2006, page 65], wherein the value "1" is used for $\alpha^0$ since $\alpha^0$ is the unity of the Galois field used.

The following H matrix is used for a 2-byte-error -correcting and 3-byte-error-detecting code:

$$H_{Byte} = \begin{pmatrix} \alpha^0 & \alpha^0 & \alpha^0 & \cdots & \alpha^0 \\ \alpha^0 & \alpha^1 & \alpha^2 & \cdots & \alpha^{2^m-2} \\ \alpha^0 & \alpha^2 & \alpha^4 & \cdots & \alpha^{2(2^m-2)} \\ \alpha^0 & \alpha^3 & \alpha^6 & \cdots & \alpha^{3(2^m-2)} \\ \alpha^0 & \alpha^4 & \alpha^8 & \cdots & \alpha^{4(2^m-2)} \end{pmatrix} \quad (3)$$

Each column of the H matrix specified in equation (3) corresponds to one byte.

If the length of the code is equal to N bytes or m·N bits (wherein each byte has m bits), only N columns of the H matrices in accordance with equation (1) or equation (3) are used. By way of example, the remaining (last) $2^m-2-N$ columns can then be deleted.

Generally, for a t-byte-error-correcting and t+1-byte -error-detecting code, the H matrix can be specified as follows:

$$H_{Byte} = \begin{pmatrix} \alpha^0 & \alpha^0 & \alpha^0 & \cdots & \alpha^0 \\ \alpha^0 & \alpha^1 & \alpha^2 & \cdots & \alpha^{2^m-2} \\ \alpha^0 & \alpha^2 & \alpha^4 & \cdots & \alpha^{2(2^m-2)} \\ \alpha^0 & \alpha^3 & \alpha^6 & \cdots & \alpha^{3(2^m-2)} \\ \alpha^0 & \alpha^4 & \alpha^8 & \cdots & \alpha^{4(2^m-2)} \\ \vdots & \vdots & \vdots & \cdots & \vdots \\ a^0 & a^{2t-1} & a^{2t-2} & \cdots & a^{2t \cdot (2^m-2)} \end{pmatrix}$$

A code that can correct 2-byte errors and detect 3-byte errors is considered by way of example below.

If an error occurs, a correct vector $v = v^0, \ldots, v^{N-1}$ is disturbed to an erroneous vector $v' = v'^0, \ldots, v'^{N-1}$.

The components $v^0, \ldots, v^{N-1}$ of the vector v are bytes that each comprise m bits, such that $v^i = v_1^i, \ldots, v_m^i$ holds true for i=0, ..., N-1. The $v_1^i, \ldots, v_m^i$ are thus the m bits of the i-th byte.

An m-bit byte can also be referred to as an element of the Galois field $GF(2^m)$.

If a 1-byte error is present, only a single byte is erroneous, that is to say that for a specific i $\in \{0, \ldots, N-1\}$ the associated i-th byte is erroneous.

If the correct i-th byte is designated by $v^i = v_1^i, \ldots, v_m^i$ and the erroneous i-th byte is designated by $v'^i = v'_1^i, \ldots, v'_m^i$, 1 or 2 or up to m bits of the correct i -th byte can differ from the erroneous i-th byte.

A byte error in the i-th byte can be described by the erroneous byte position i and a byte error value $$e^i = v^i \oplus v'^i = v_1^i \oplus v'_1^i, \ldots, v_m^i \oplus v'_m^i.$$

In this case, it should be noted that "$\oplus$" denotes the exclusive-OR operation.

The position of an i-th byte can also be designated by $\alpha^i$.

If the intention is to correct a byte error having the byte error value ei in the byte position i, then a byte error correction value that is equal to the byte error value is to be determined for the byte position i.

In this example, for a byte error to be corrected, the byte error value is equal to the byte error correction value; in this respect, the terms byte error value and byte error correction value can be used synonymously.

In order to avoid a confusing number of indices, hereinafter byte error values are designated by the alphabetic letters a, b, c.

A byte error correction value for the i-th byte can also be designated by a(i).

Byte positions can be designated by i, j, k, ... or by $\alpha^i$, $\alpha^j$, $\alpha^k$, ..., wherein $\alpha$ is a generating element of the Galois field $GF(2^m)$.

An error syndrome s has syndrome components (also referred to as components, error syndrome components, partial error syndromes or partial syndromes) $s_1, s_2, s_3, s_4, s_5$, which are determined for the H matrix in accordance with equation (4) as:

$$s_1 = (\alpha^0, \alpha^0, \alpha^0, \ldots, \alpha^0) \cdot (v'^0, \ldots, v'^{M-1})^T,$$

$$s_2 = (\alpha^0, \alpha^1, \alpha^2, \ldots, \alpha^{2^m-2}) \cdot (v'^0, \ldots, v'^{M-1})^T,$$

$$s_3=(\alpha^0, \alpha^2, \alpha^4, \ldots, \alpha^{2(2^m-2)})\cdot(v'^0, \ldots, v'^{M-1})^T,$$

$$s_4=(\alpha^0, \alpha^3, \alpha^6, \ldots, \alpha^{3(2^m-2)})\cdot(v'^0, \ldots, v'^{M-1})^T,$$

$$s_5=(\alpha^0, \alpha^4, \alpha^8, \ldots, \alpha^{4(2^m-2)})\cdot(v'^0, \ldots, v'^{M-1})^T,$$

$$\ldots$$

$$s_{2t+1}=(\alpha^0, \alpha^{2t}, \alpha^{2\cdot(2t)}, \ldots, \alpha^{2t\cdot(2^m-2)})\cdot(v'^0, \ldots, v'^{M-1})^T.$$

In this case, $$v'=(v'^0, \ldots, v'^{M-1})^T$$

is a column vector having a number of M components each having m bits. This column vector can also be referred to as a transposed vector of the row vector $(v'^0, \ldots, v'^{M-1})$.

Each of the syndrome components $s_1, s_2, \ldots s_{2t+1}$ is a byte having m bits.

If a 1-byte error is present, then it holds true that $s_1 \neq 0$ and $$Det\begin{pmatrix} s_1 & s_2 \\ s_2 & s_3 \end{pmatrix} = 0. \tag{5}$$

If a 2-byte error is present, then it holds true that $$Det\begin{pmatrix} s_1 & s_2 \\ s_2 & s_3 \end{pmatrix} \neq 0 \tag{6}$$

and $$Det\begin{pmatrix} s_1 & s_2 & s_3 \\ s_2 & s_3 & s_4 \\ s_3 & s_4 & s_5 \end{pmatrix} = 0. \tag{7}$$

If a 3-byte error is present, then it holds true that $$Det\begin{pmatrix} s_1 & s_2 & s_3 \\ s_2 & s_3 & s_4 \\ s_3 & s_4 & s_5 \end{pmatrix} \neq 0 \tag{8}$$

and $$Det\begin{pmatrix} s_1 & s_2 & s_3 & s_4 \\ s_2 & s_3 & s_4 & s_5 \\ s_3 & s_4 & s_5 & s_6 \end{pmatrix} = 0. \tag{9}$$

This can be correspondingly continued up to a t-byte error: in this regard, a t-byte error is present if it holds true that:

$$Det\begin{pmatrix} s_1 & s_2 & s_3 & \cdots & s_t \\ s_2 & s_3 & s_4 & \cdots & s_{t+1} \\ \vdots & \vdots & \vdots & \cdots & \vdots \\ s_t & s_{t+1} & s_{t+2} & \cdots & s_{2t-1} \end{pmatrix} \neq 0 \tag{10}$$

and $$Det\begin{pmatrix} s_1 & s_2 & s_3 & \cdots & s_{t+1} \\ s_2 & s_3 & s_4 & \cdots & s_{t+2} \\ \vdots & \vdots & \vdots & \cdots & \vdots \\ s_t & s_{t+1} & s_{t+2} & \cdots & s_{2t} \end{pmatrix} = 0. \tag{11}$$

The number of byte errors can be determined by the determination of the values of the specified determinant. This is complex as the number of possible errors increases: in this regard, for establishing whether a t-byte error is present according to equations (10) and (11), it is necessary to determine the value of a determinant having 2·t syndrome components as elements. These are to be stored in addition to the payload data bytes. Each syndrome component corresponds to a byte having m bits.

A byte error position can be determined for example as zeros of the locator polynomial.

A zero of a locator polynomial can be described as an element of the corresponding Galois field $GF(2^m)$.

In this case, a first, second, third element, etc. of the Galois field is designated by $\alpha_1, \alpha_2, \alpha_3$, etc. This does not stipulate which element of the Galois field is specifically involved.

If $$\{\alpha^0, \alpha^1, \alpha^2, \ldots, \alpha^i, \ldots, \alpha^{2^m-2}\}$$

is for example the set of the $2^m-1$ elements of the Galois field not equal to 0 in their exponential representation, then $\alpha_1, \alpha_2, \alpha_3$, etc. are elements of this set. By way of example, $$\alpha_1 = \alpha^{10},$$

$$\alpha_2 = \alpha^3,$$

$$\alpha_3 = \alpha^0$$

or some other assignment can hold true.

The locator polynomials result as follows for the different numbers of byte errors:

for a 1-byte error:

$$L_1(x) = (x+\alpha_1) = x + \sigma(1)_1; \tag{12}$$

for a 2-byte error:

$$L_2(x) = (x+\alpha_1)(x+\alpha_2) = x^2 + x\sigma(2)_1 + \sigma(2)_2; \tag{13}$$

for a 3-byte error:

$$L_3(x) = (x + \alpha_1)(x + \alpha_2)(x + \alpha_3) = \tag{14}$$
$$= x^3 + x^2\sigma(3)_1 + x^2\sigma(3)_2 + \sigma(3)_3;$$

for a 4-byte error:

$$L_n(x) = (x + \alpha_1)(x + \alpha_2)(x + \alpha_3)(x + \alpha_4) = \tag{15}$$
$$= x^4 + x^3\sigma(4)_1 + x^2\sigma(4)_2 + x\sigma(4)_3 + \sigma(4)_4;$$

for a n-byte error:

$$L_n(x) = (x + \alpha_1)(x + \alpha_2) \cdot \ldots \cdot (x + \alpha_n) = \tag{16}$$
$$x^n + x^{n-1}\sigma(n)_1 + x^{n-2}\sigma(n)_2 + \ldots + \sigma(n)_n.$$

In this case, the coefficient $\sigma(j)_i$ of a locator polynomial for $j=1, \ldots, n$ and $i=1, \ldots, n$ denotes a known elementary symmetric function of j variables $\alpha_i$ to $\alpha j$. This can be verified by multiplying out $$(x+\alpha_1)(x+\alpha_2)\cdot \ldots \cdot (x+\alpha_n)$$

In this regard, it holds true for example that $$\sigma(1)_1 = \alpha_1$$

$$\sigma(2)_1 = \alpha_1 + \alpha_2,$$

$$\sigma(2)_2 = \alpha_1 \cdot \alpha_2,$$

$$\sigma(3)_1 = \alpha_1 + \alpha_1 + \alpha_3,$$

$$\sigma(3)_2 = \alpha_1 19 \, \alpha_2 + \alpha_1 \cdot \alpha_3 + \alpha_2 \cdot \alpha_3,$$

$$\sigma(3)_3 = \alpha_1 \cdot \alpha_2 \cdot \alpha_3,$$

$$\sigma(4)_1 = \alpha_1 + \alpha_1 + \alpha_3 + \alpha_4,$$

$$\sigma(4)_2 = \alpha_1 \cdot \alpha_2 + \alpha_1 \cdot \alpha_3 + \alpha_1 \cdot \alpha_4 + \alpha_2 \cdot \alpha_3 + \alpha_2 \cdot \alpha_4 + \sigma_3 \cdot \alpha_4,$$

$$\sigma(4)_3 = \alpha_1 \cdot \alpha_2 \cdot \alpha_3 + \alpha_1 \cdot \alpha_2 \cdot \alpha_4 + \alpha_1 \cdot \alpha_3 \cdot \alpha_4 + \alpha_2 \cdot \alpha_3 \cdot \alpha_4,$$

$$\sigma(4)_4 = \alpha_1 \cdot \alpha_2 \cdot \alpha_3 \cdot \alpha_4,$$

. . .
. . .

$$\sigma(n)_1 = \alpha_1 + \alpha_1 + \ldots + \alpha_n,$$

. . .

$$\sigma(n)_n = \alpha_1 \cdot \alpha_2 \cdot \ldots \cdot \alpha_n.$$

In this case, as illustrated in the examples, a symmetric function $\sigma(k)_i$ where $1 \leq i \leq k$ is dependent on k variables $\alpha_1, \ldots, \alpha_k$. It contains all possible $$\binom{k}{i}$$

different products of its variables which are combined by way of the operation "+" in the Galois field GF($2^m$). If i=1, the $$\binom{k}{i} = k$$

products each consist only of one of the variables. The addition is effected in the Galois field GF($2^m$). It corresponds here to component-by-component addition modulo 2. The variables $\alpha_1, \alpha_2, \alpha_3$, etc. are used here as variables of the symmetric functions.

Between the components of the error syndromes and the components of the corresponding locator polynomials, the following relationship is known for a t-byte error:

$$\begin{pmatrix} s_1 & s_2 & s_3 & \cdots & s_t \\ s_2 & s_3 & s_4 & \cdots & s_{t+1} \\ s_3 & s_4 & s_5 & \cdots & s_{t+1} \\ \vdots & \vdots & \vdots & \cdots & \vdots \\ s_{t-1} & s_t & s_{t+1} & \cdots & s_{2t-2} \\ s_t & s_{t+1} & s_{t+2} & \cdots & s_{2t-1} \end{pmatrix} \cdot \begin{pmatrix} \sigma(t)_t \\ \sigma(t)_{t-1} \\ \sigma(t)_{t-2} \\ \vdots \\ \sigma(t)_2 \\ \sigma(t)_1 \end{pmatrix} = \begin{pmatrix} -s_{t+1} \\ -s_{t+2} \\ -s_{t+3} \\ \vdots \\ -s_{2t-1} \\ -s_{2t} \end{pmatrix}. \quad (17)$$

This is described for example in [Wicker, S.: Error Control Systems for Digital Communication and Storage, Prentice Hall, 1995, pages 215], where the designation $S_i$ is used for the syndrome component $s_i$ and the designation $\Lambda_i$ is used for the coefficient $\sigma(t)_i$.

If, by way of example, a Galois field GF($q^m$) where q32 2 is used, the negative signs in equation (17) can be omitted since addition and subtraction are identical in a Galois field GF($2^m$). By way of example, hereinafter the Galois field GF($2^m$) is used and the negative signs in equation (17) are omitted.

Further (Additional) Byte Error in the Case of a Byte Error at a Given Byte Error Position An explanation is given below by way of example of how a further byte error position is determined if a further byte error has occurred, or it is determined that no further byte error has occurred if a number of $N_1$ byte errors is known.

In this case, the number of byte errors $N_1$ is greater than or equal to 1.

It is taken into account that one byte error or a plurality of byte errors has/have already occurred beforehand. The at least one further byte error may then occur in accordance with the above formulation.

If, for example, $N_1$ byte error positions have been determined, then a further $(N_1+1)$-th byte error position can be determined if a byte error has occurred at this position. If no further byte error position is erroneous, then no further byte error has occurred either.

It should be noted here that a byte error that has occurred is a byte error that is detectable by means of an error code. It is conceivable for a non-detectable byte error to be present, which remains undetected and in this respect is regarded as not having occurred in accordance with the present explanations.

For example, a first byte error position $\alpha_1$ is given. The byte error position states that an error was detected for this byte comprising a plurality of bits.

If a further byte error has occurred in a different byte, a second byte error position $\alpha_2$ can be determined. Moreover, it can be determined that no further byte error position is present if no second byte error has occurred.

In the case of a 1-byte error with the predefined byte error position $\alpha_1$ and with a byte error value $\alpha$, it holds true that $$s_1 \alpha, \quad (18)$$

$$s_2 = \alpha_1 \cdot \alpha = s_1 \cdot \alpha_1. \quad (19)$$

It is not necessary for the byte error value $\alpha$ to be known. In the case of a 2-byte error with the known byte error position $\alpha_1$ with a byte error value a and a further (still unknown) byte error position $\alpha_2$ with a byte error value b, it holds true that $$s_1 = a+b, \quad (20)$$

$$s_2 = \alpha_1 \cdot a + \alpha_2 \cdot b, \quad (21)$$

$$s_3 = \alpha_1^2 \cdot a + \alpha_2^2 \cdot b \quad (22)$$

and thus $$s_1 \cdot \alpha_1 = (a+b) \cdot \alpha_1 = a \cdot \alpha_1 + b \cdot \alpha_1 \neq s_2 = a \cdot \alpha_1 + b \cdot \alpha_2. \quad (23)$$

It is not necessary for the values $\alpha_2$, a and b to be known. Given a known byte error position $\alpha_1$, on the basis of $$s_1 \cdot \alpha_1 + s_2 = 0 \quad (24)$$

it can be determined that no 2-byte error is present, and on the basis of $$s_1 \cdot \alpha_1 + s_2 \neq 0 \quad (25)$$

it can be established that no 1-byte error is present.

If no 1-byte error is present, rather a 2-byte error with a known byte error position $\alpha_1$ and a byte error position $\alpha_2$ to be determined is present, then it holds true that $$s_1\sigma(2)_2+s_2\sigma(2)_1=s_3 \quad (26)$$

where $$\sigma(2)_2=\alpha_1\cdot\alpha_2=\sigma(1)_1\cdot\alpha_2 \text{ and } \sigma(2)_1=\alpha_1+\alpha_2=\sigma(1)_1+\alpha_2$$

and thus $$s_1\cdot\alpha_1\cdot\alpha_2+s_2(\alpha_1+\alpha_2)=s_3=s_1\cdot\sigma(1)_1\cdot\alpha_2+s_2(\sigma(1)_1+\alpha_2). \quad (27)$$

Equation (27) is solvable with respect to the byte error position $\alpha_2$ to be determined:

$$\alpha_2 = \frac{s_3+s_2\cdot\alpha_1}{s_1\cdot\alpha_1+s_2} = \frac{s_3+s_2\cdot\sigma(1)_1}{s_1\cdot\sigma(1)_1+s_2)}. \quad (28)$$

The byte error position $\alpha_2$ is determinable from the three syndrome components $s_1$, $s_2$, $s_3$ and the symmetric functions $\sigma(1)_1=\alpha_1$. As explained, the byte error position $\alpha_1$ is previously known. It is therefore not necessary to determine the solutions of the corresponding locator polynomial.

Further (Additional) Byte Error in the Case of Two Byte Errors at Two (Different) Given Byte Error Positions Alternatively, a description is given of how, in the case of two known byte error positions $\alpha_1$ and $\alpha_2$, it is determined whether a third byte error is present and, if a third byte error is present, how a third byte error position can then be determined. In this case, the byte error positions $\alpha_1$, $\alpha_2$ and $\alpha_3$ differ from one another.

If a 2-byte error is present, it holds true that $$s_1\cdot\sigma(2)_2+s_2(2)\cdot\sigma(2)_1+s_3=0. \quad (29)$$

This results from:

$$s_1=a+b,$$

$$s_2=\alpha_1\cdot a+\alpha_2\cdot b,$$

$$s_3=\alpha_1^2\cdot a+\alpha_2^2\cdot b,$$

$$\sigma(2)_2=\alpha_1\cdot\alpha_2,$$

$$\sigma(2)_1=\alpha_1+\alpha_2,$$

In this case, a and b are the corresponding byte error values and $\alpha_1$ and $\alpha_1$ are the byte error positions. If equation (29) holds true, then no 3-byte error is present.

If a 3-byte error with the byte error values a, b and c and the byte error positions $\alpha_1$, $\alpha_2$, $\alpha_3$ is present then it holds true that:

$$s_1=a+b+c,$$

$$s_2=\alpha_1\cdot a+\alpha_2\cdot b+\alpha_3\cdot c,$$

$$s_3=\alpha_1^2\cdot a+\alpha_2^2\cdot b+\alpha_3^2\cdot c,$$

$$\sigma(2)_2=\alpha_1\cdot\alpha_2,$$

$$\sigma(2)_1=\alpha_1+\alpha_2,$$

This yields the following:

$$s_1\cdot\sigma(2)_2+s_2\cdot\sigma(2)_1+s_3 =$$

$$c\cdot(\alpha_1\alpha_2+\alpha_1\alpha_3+\alpha_2\alpha_3+\alpha_3^2) = c\cdot(\alpha_1+\alpha_3)\cdot(\alpha_2+\alpha_3) = D.$$

A value D=0 is only possible if (at least) one of the following conditions is met:

c=0;

$\alpha_3=\alpha_1$ or $\alpha_3=\alpha_2$ which is at odds with the fact that the byte error positions $\alpha_1$, $\alpha_2$ and $\alpha_3$ are different.

A 3-byte error can thus be detected from the validity of the inequality $$s_1=\sigma(2)_2+s_2\sigma(2)_1+s_3\neq 0$$

If a 3-byte error is present, then the third byte error position $\alpha_3$ can be determined using the known byte error positions $\alpha_1$, $\alpha_2$ and from the syndrome components $s_1$, $s_2$, $s_3$ and $s_4$ in accordance with the relationship $$s_1\cdot\sigma(3)_3+s_2\cdot\sigma(3)_2+s_3\cdot\sigma(3)_1=s_4 \quad (30)$$

where $$\sigma(3)_3=\alpha_1\cdot\alpha_2\cdot\alpha_3,$$

$$\sigma(3)_2=\alpha_1\cdot\alpha_2+\alpha_1\cdot\alpha_3+\alpha_2\cdot\alpha_3,$$

$$\sigma(3)_1=\alpha_1+\alpha_2+\alpha_3$$

The byte error position $\alpha_3$ is the erroneous further (i.e. additional) byte error position to be determined. It follows from equation (30) that $$s_4 = s_1\cdot\alpha_1\alpha_2\alpha_3 + s_2\cdot(\alpha_1\alpha_2+\alpha_1\alpha_3+\alpha_2\alpha_3) + s_3\cdot(\alpha_1+\alpha_2+\alpha_3) =$$

$$s_1\cdot\sigma(2)_2\alpha_3 + s_2\cdot[\sigma(2)_1\cdot\alpha_3+\sigma(2)_2]+s_3\cdot[\sigma(2)_1+\alpha_3]$$

and thus for the byte error position $\alpha_3$ to be determined:

$$\alpha_3 = \frac{s_4+s_3\cdot\sigma(2)_1+s_2\cdot\sigma(2)_2}{s_3+s_2\cdot\sigma(2)_1+s_1\cdot\sigma(2)_2} = \frac{s_4+s_3\cdot[\alpha_1+\alpha_2]+s_2\cdot\alpha_1\alpha_2}{s_3+s_2\cdot[\alpha_1+\alpha_2]+s_1\cdot\alpha_1\alpha_2} \quad (31)$$

The byte error position $\alpha_3$ is determinable from the four syndrome components $s_1$, $s_2$, $s_3$, $s_4$ and the symmetric functions $\sigma(2)_1$, $\sigma(2)_2$ which emerge from the known byte error positions $\alpha_1$ and $\alpha_2$. It is not necessary to ascertain the solutions of the corresponding locator polynomial (here: third degree) or to use more than four syndrome components. This reduces the complexity to a considerable extent.

Further (Additional) Byte Error in the Case of a Plurality of Byte Errors at Different Given Byte Error Positions This approach can be extended accordingly: A further byte error position can be determined if three or more byte error positions are previously known. If k byte error positions are known, then k+2 error syndrome components are known.

For example, the following hold true for the byte error positions to be determined $\alpha_4$, if three byte error positions $\alpha_1 \ldots \alpha_3$ are known:

$$\alpha_4 = \frac{s_5+s_4\sigma(3)_1+s_3\sigma(3)_2+s_2\sigma(3)_3}{s_4+s_3\sigma(3)_1+s_2\sigma(3)_2+s_1\sigma(3)_3}; \quad (32)$$

$\alpha_5$, if four byte error positions $\alpha_1 \ldots \alpha_4$ are known:

$$\alpha_5 = \frac{s_6 + s_5\sigma(4)_1 + s_4\sigma(4)_2 + s_3\sigma(4)_3 + s_2\sigma(4)_4}{s_5 + s_4\sigma(4)_1 + s_3\sigma(4)_2 + s_2\sigma(4)_3 + s_1\sigma(4)_4}; \quad (33)$$

$\alpha_6$, if five byte error positions $\alpha_1 \ldots \alpha_5$ are known:

$$\alpha_6 = \frac{s_7 + s_6\sigma(5)_1 + s_5\sigma(5)_2 + s_4\sigma(5)_3 + s_3\sigma(5)_4 + s_2\sigma(t)_5}{s_6 + s_5\sigma(5)_1 + s_4\sigma(5)_2 + s_3\sigma(5)_3 + s_2\sigma(5)_4 + s_1\sigma(5)_5}; \quad (34)$$

$\alpha_7$, if six byte error positions $\alpha_1 \ldots \alpha_6$ are known:

$$\alpha_7 = \frac{s_8 + s_7\sigma(6)_1 + s_6\sigma(6)_2 + s_5\sigma(6)_3 + s_4\sigma(6)_4 + s_3\sigma(6)_5 + s_2\sigma(6)_6}{s_7 + s_6\sigma(6)_1 + s_5\sigma(6)_2 + s_4\sigma(6)_3 + s_3\sigma(6)_4 + s_2\sigma(6)_5 + s_1\sigma(6)_6}. \quad (35)$$

In general, for $N_1$ known byte error positions $\alpha_1, \ldots, \alpha_{N1}$, the further byte error position $\alpha_{N1+1}$ results as:

$$\alpha_{N_1+1} = \frac{s_{N_1+2} + s_{N_1+1}\sigma(N_1)_1 + s_{N_1}\sigma(N_1)_2 + \ldots + s_2\sigma(N_1)_{N_1}}{s_{N_1+1} + s_{N_1}\sigma(N_1)_1 + s_{N_1-1}\sigma(N_1)_2 + \ldots + s_1\sigma(N_1)_{N_1}}. \quad (36)$$

It can be advantageous to use the following symmetric functions $\sigma(j)_i$ where $j \geq 1$ and $i \leq j$: the function $\sigma(j)_i$ for $j > 1$ arises from the functions $\sigma(j-1)_k$ where $k \leq j-1$ and a further variable $\alpha_k$:

$$\sigma(2)_1 = \sigma(1)_1 + \alpha_2 \quad (37)$$

$$\sigma(2)_2 = \sigma(1)_1 + \alpha_2 \quad (38)$$

$$\sigma(3)_1 = \sigma(2)_1 + \alpha_3 \quad (39)$$

$$\sigma(3)_2 = \sigma(2)_1 \cdot \alpha_3 + \sigma(2)_2 \quad (40)$$

$$\sigma(3)_3 = \sigma(2)_2 \cdot \alpha_3 \quad (41)$$

$$\sigma(4)_1 = \sigma(3)_1 + \alpha_4 \quad (42)$$

$$\sigma(4)_2 = \sigma(3)_1 \cdot \alpha_4 + \sigma(3)_2 \quad (43)$$

$$\sigma(4)_3 = \sigma(3)_2 \cdot \alpha_4 + \sigma(3)_3 \quad (44)$$

$$\sigma(4)_4 = \sigma(4)_3 \cdot \alpha_4 \quad (45)$$

$\ldots$ $$\sigma(n+1)_1 = \sigma(n)_1 + \alpha_{n+1} \quad (46)$$

$$\sigma(n+1)_2 = \sigma(n)_1 \cdot \alpha_{n+1} + \sigma(n)_2 \quad (47)$$

$$\sigma(n+1)_3 = \sigma(n)_2 \cdot \alpha_{n+1} + \sigma(n)_3 \quad (48)$$

$\ldots$ $$\sigma(n+1)_{n+1} = \sigma(n)_n \cdot \alpha_{n+1} \quad (49)$$

Consequently, from already ascertained symmetric functions $\sigma(j)_i$ and an additional variable, further symmetric functions can be determined step by step and used for ascertaining the further byte error position.

Exemplary Implementation

FIG. 2 shows a symbolic arrangement, as a realization of a circuit, for example, which makes it possible to determine the symmetric functions $\sigma(2)_1=\alpha_1+\alpha_2$ and $\sigma(2)_2=\alpha_1 \cdot \alpha_2$ on the basis of the byte error positions $\alpha_1$ and $\alpha_2$.

An adder 21 having two m-bit-wide inputs and an m-bit-wide output enables the component-by-component addition modulo 2 (XORing) of the byte error positions $\alpha_1$ and $\alpha_2$ present at the inputs. A Galois field multiplier 22 having two m-bit-wide inputs and an m-bit-wide output enables the multiplication $\alpha_1 \cdot \alpha_2$.

FIG. 3 shows an exemplary circuit arrangement for determining a byte error position as using the syndrome components $s_1$ and $s_4$ and two known byte error positions $\alpha_1$, $\alpha_2$ according to equation (31). In this case, the byte error positions $\alpha_1$, $\alpha_2$ were combined in accordance with the arrangement shown in FIG. 2 to form the symmetric functions $\sigma(2)_1$ and $\sigma(2)_2$, which are input signals of the arrangement shown in FIG. 3.

FIG. 3 has Galois field multipliers 11 to 15, having two m-bit-wide inputs and an m-bit-wide output. Furthermore, two adders 16, 17 having two m-bit-wide inputs and an m-bit-wide output for component-by-component addition modulo 2 (XORing) and an inverter 18 having an m-bit-wide input and an m-bit-wide output are illustrated. The components 11 to 18 are arranged in such a way that their circuity interconnection yields the byte error position $\alpha_3$ as a result.

These examples proposed herein can be based on at least one of the following solutions. In particular, combinations of the following features can be used in order to achieve a desired result. The features of the method can be combined with (any) arbitrary feature (s) of the device or of the circuit, or vice versa.

In order to achieve the object, a method for error processing is proposed,
wherein n byte error positions of n byte errors are predefined, wherein n is a positive integer,
which method involves determining whether there is a further byte error position on the basis of the n byte error positions and on the basis of n+1 error syndrome components of a first error code.

In one development, the further byte error position is determined by way of the n byte error positions and the n+1 error syndrome components of the first error code.

In one development, the first error code is a byte error code, in particular a Reed-Solomon code.

One development involves detecting that no further byte error is present if no further byte error position is determinable.

In one development, the further byte error position is determined depending on at least one symmetrical function of the n byte error positions.

In one development,
in the error-free case a byte of the first error code is transformed into a code word of a second error code,
a byte error position is determined if a non-code word of the second error code is detected.

In one development, the second error code is an $n_1$-out-of-n code, wherein $1 \leq n_1 < n \leq 2$ holds true.

In one development, code words of the second error code are stored in a memory.

In one development, in the error-free case code words of the second error code are read out from the memory and transformed back into bytes of the first error code. In one development, the reading out from the memory is effected taking account of a temporal order.

In one development, if a non-code word of the second error code is detected in the course of the reading out from the memory, a byte error position is determined for this byte of the first error code.

In one development, the further byte error position $\alpha_2$ is determinable such that the following holds true:

$$\alpha_2 = \frac{s_3 + s_2 \cdot \alpha_1}{s_1 \cdot \alpha_1 + s_2},$$

wherein $\alpha_1$ denotes the predefined byte error position and $s_1, s_2, s_3$ denote syndrome components.

Moreover, a device for error processing is proposed, which is configured to determine whether there is a further byte error position on the basis of n byte error positions and on the basis of n+1 error syndrome components of a first error code, wherein the n byte error positions of n byte errors are predefined and wherein n is a positive integer.

In one development, the device is furthermore configured to determine the further byte error position by way of the n byte error positions and the n+1 error syndrome components of the first error code.

A circuit arrangement is also specified, comprising at least one of the devices described herein.

The device and/or circuit arrangement can be embodied as parts of an integrated circuits or memory chip or separately therefrom.

An method for error processing is further described, including reading a memory, the memory including a plurality of physical bytes, each physical byte containing k physical bits, the memory containing data stored in the memory in a format comprising a plurality j of logical bytes each having m bits of a first error code, wherein only certain possible values of the j bytes represent codewords of the first error code, the data of each logical byte of m bits being stored in each physical byte using a second error code, whereby only 2m codewords of the second error code are allowed values to be stored in the k bits of the physical bytes, wherein j, k and m are all integers and m<k, the method comprising:
reading a plurality of j bytes from the memory,
determining n byte error positions of the j read bytes, the n byte error positions being the byte positions for which the k physical bits of the respective byte do not form a codeword of the second error codewherein n byte error positions of n byte errors are predefined, wherein n is a positive integer and n<j, and
which method involves determining whether there is a further byte error position on the basis of the n byte error positions and on the basis of n+1 error syndrome components of a the first error code.

The invention claimed is:

1. A method for error processing,
reading a plurality of bytes from a memory;
wherein n byte error positions of n byte errors are predetermined, wherein n is a positive integer,
which method involves determining whether there is a further byte error position on the basis of the n byte error positions and on the basis of n+1 error syndrome components of a first error code, and
in the event of determining a further byte error position,
(a) correcting a byte of the plurality of bytes read from the memory at the further byte error position and/or
(b) outputting the further byte error position.

2. The method according to claim 1, wherein the further byte error position is determined by way of the n byte error positions and the n+1 error syndrome components of the first error code.

3. The method according to claim 1, wherein the first error code comprises a byte error code, wherein the byte error code comprises a Reed-Solomon code.

4. The method according to claim 1, which involves detecting that no further byte error is present if no further byte error position is determinable.

5. The method according to claim 1, wherein the further byte error position is determined depending on at least one symmetrical function of the n byte error positions.

6. The method according to claim 5, wherein, if a non-code word of the second error code is detected in the course of the reading out from the memory, a byte error position is determined for this byte of the first error code.

7. The method according to claim 1, wherein
in the error-free case a byte of the first error code is transformed into a code word of a second error code,
a byte error position is determined if a non-code word of the second error code is detected.

8. The method according to claim 7, wherein code words of the second error code are stored in a memory.

9. The method according to claim 1, wherein the second error code is an $n_1$-out-of-$n_2$ code, wherein $1 \leq n_1 < n_2 \leq 2$ holds true.

10. The method according to claim 9, wherein the reading out from the memory is effected taking account of a temporal order.

11. The method according to claim 1, wherein in the error-free case code words of the second error code are read out from the memory and transformed back into bytes of the first error code.

12. The method according to claim 1, wherein the further byte error position az is determinable such that the following holds true:

$$\alpha_2 = \frac{s_3 + s_2 \cdot \alpha_1}{s_1 \cdot \alpha_1 + s_2},$$

wherein $\alpha_1$ denotes the predefined byte error position and $s_1, s_2, s_3$ denote syndrome components.

13. The memory circuit comprising:
a memory for storing a plurality of memory bytes, and
a device for error processing, which is configured to determine whether there is a further byte error position on the basis of n byte error positions and on the basis of n+1 error syndrome components of a first error code, wherein the n byte error positions of n byte errors are predefined and wherein n is a positive integer.

14. The memory circuit according to claim 13, wherein the device is furthermore configured to determine the further byte error position by way of the n byte error positions and the n+1 error syndrome components of the first error code.

15. A non-transitory computer-readable storage medium having instructions stored thereon that, when executed, cause one or more processors to:
store a plurality of memory bytes; and
determine whether there is a further byte error position on a basis of n byte error positions and on a basis of n+1 error syndrome components of a first error code, wherein the n byte error positions of the n byte errors are predefined and wherein n is a positive integer.

* * * * *